United States Patent
Yoo et al.

(10) Patent No.: US 9,633,923 B2
(45) Date of Patent: Apr. 25, 2017

(54) ELECTRONIC DEVICE MODULE AND MANUFACTURING METHOD THEREOF

(71) Applicant: SAMSUNG ELECTRO-MECHANICS CO., LTD., Suwon-Si, Gyeonggi-Do (KR)

(72) Inventors: Do Jae Yoo, Suwon-Si (KR); Jae Hyun Lim, Suwon-Si (KR); Sun Ho Kim, Suwon-Si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 240 days.

(21) Appl. No.: 14/339,075

(22) Filed: Jul. 23, 2014

(65) Prior Publication Data

US 2015/0062829 A1    Mar. 5, 2015

(30) Foreign Application Priority Data

Aug. 28, 2013   (KR) .................... 10-2013-0102355

(51) Int. Cl.
| | |
|---|---|
| H01L 23/31 | (2006.01) |
| H01L 23/498 | (2006.01) |
| H01L 21/48 | (2006.01) |

(52) U.S. Cl.
CPC ...... *H01L 23/3121* (2013.01); *H01L 21/4853* (2013.01); *H01L 23/49811* (2013.01); *H01L 23/49827* (2013.01); *H01L 2224/16225* (2013.01); *H01L 2924/0002* (2013.01); *H01L 2924/15311* (2013.01); *H01L 2924/19105* (2013.01); *H01L 2924/19106* (2013.01); *H01L 2924/19107* (2013.01); *Y10T 29/4913* (2015.01)

(58) Field of Classification Search
USPC .......................................... 361/760, 761, 728
See application file for complete search history.

(56) References Cited

U.S. PATENT DOCUMENTS

| | | |
|---|---|---|
| 8,139,368 B2 | 3/2012 | Nomura |
| 2002/0167085 A1 | 11/2002 | Ohuchi et al. |
| 2004/0158978 A1 | 8/2004 | Lee et al. |

(Continued)

FOREIGN PATENT DOCUMENTS

| | | |
|---|---|---|
| JP | 2000-353766 A | 12/2000 |
| JP | 4072816 B2 | 4/2008 |

(Continued)

OTHER PUBLICATIONS

Notice of Office Action Korean Patent Application No. 10-2013-0102355 dated Nov. 26, 2014 with full English translation.

*Primary Examiner* — Andargie M Aychillhum
(74) *Attorney, Agent, or Firm* — NSIP Law

(57) ABSTRACT

There are provided an electronic device module capable of increasing a degree of integration by mounting electronic components on both surfaces of a board, and a manufacturing method thereof. The electronic device module includes a board having mounting electrodes formed on both surfaces thereof, a plurality of electronic devices mounted on the mounting electrodes, a molded portion sealing the electronic devices, at least one connection wire having one end bonded to one surface of the board and the other end exposed to the outside of the molded portion, and an external connection terminal coupled to the other end of the connection wire.

8 Claims, 8 Drawing Sheets

(56) References Cited

U.S. PATENT DOCUMENTS

| | | | |
|---|---|---|---|
| 2006/0063312 A1* | 3/2006 | Kurita | H01L 21/563 438/127 |
| 2012/0248933 A1* | 10/2012 | Tsuda | H03H 9/1092 310/313 B |
| 2012/0320536 A1 | 12/2012 | Yamamoto | |

FOREIGN PATENT DOCUMENTS

| | | |
|---|---|---|
| JP | 4926787 B2 | 5/2012 |
| JP | 5171726 B2 | 3/2013 |
| KR | 2003-0074590 A | 9/2003 |
| KR | 10-0532436 B1 | 11/2005 |
| WO | 02/075020 A1 | 9/2002 |

* cited by examiner

ELECTRONIC DEVICE MODULE AND MANUFACTURING METHOD THEREOF

CROSS-REFERENCE TO RELATED APPLICATION

This application claims the benefit of Korean Patent Application No. 10-2013-0102355 filed on Aug. 28, 2013, with the Korean Intellectual Property Office, the disclosure of which is incorporated herein by reference.

BACKGROUND

The present disclosure relates to an electronic device module and a manufacturing method thereof, and more particularly, to an electronic device module allowing for an increase in a degree of device integration by mounting electronic components on both surfaces of a board, and a manufacturing method thereof.

The demand for portable apparatuses has recently increased in the electronic products market. Therefore, the miniaturization and lightening of electronic devices mounted in the electronic apparatuses has been continuously demanded.

In order to realize the miniaturization and the lightening of electronic devices, a system on chip (SOC) technology of implementing a plurality of individual devices on a single chip, a system in package (SIP) technology of integrating a plurality of individual devices in a single package, and the like, as well as a technology of decreasing the respective sizes of mounted components, are required.

Meanwhile, in order to manufacture an electronic device module having a small size and a high performance, a structure in which electronic components are mounted on both surfaces of a board has also been developed.

However, in the case in which the electronic components are mounted on both surfaces of the board, it may be difficult to form external connection terminals on the board.

That is, since the electronic components are mounted on both surfaces of the board, positions in which the external connection terminals are formed may not be accurate. Therefore, a double-sided mounting type electronic device module in which the external connection terminals may be more easily formed, and a manufacturing method thereof have been demanded.

RELATED ART DOCUMENT (Patent Document 1) U.S. Patent Application Publication No. 2012-0320536

SUMMARY

An aspect of the present disclosure may provide a double-sided mounting type electronic device module in which electronic products may be mounted on both surfaces of a board.

An aspect of the present disclosure may also provide a manufacturing method allowing for a double-sided mounting type electronic device module to be easily manufactured.

An aspect of the present disclosure may also provide a manufacturing method allowing external connection terminals of a double-sided mounting type electronic device module to be easily formed.

According to an aspect of the present disclosure, an electronic device module may include: a board having mounting electrodes formed on both surfaces thereof; a plurality of electronic devices mounted on the mounting electrodes; a molded portion sealing the electronic devices; at least one connection wire having one end bonded to one surface of the board and the other end exposed to the outside of the molded portion; and an external connection terminal coupled to the other end of the connection wire.

The molded portion may have at least one terminal groove formed in one surface thereof, and the other end of the connection wire may be exposed to the terminal groove.

The external connection terminal may be coupled to the connection wire protruding into the terminal groove.

At least a portion of the external connection terminal may be accommodated in the terminal groove.

The electronic device module may further include a metal layer formed on an internal surface of the terminal groove and a surface of the connection wire.

The electronic device module may further include a metal layer filled in the terminal groove to form an electrode pad.

The external connection terminal may be bonded to the electrode pad.

The connection wire may be formed of a bonding wire.

According to another aspect of the present disclosure, a manufacturing method of an electronic device module may include: preparing a board having mounting electrodes formed on both surfaces thereof; mounting at least one electronic device on the mounting electrodes; bonding at least one connection wire to a lower surface of the board; and sealing the connection wire of the board.

The manufacturing method of an electronic device module may further include, after the mounting of the at least one electronic device, sealing the at least one electronic device mounted on an upper surface of the board.

The manufacturing method of an electronic device module may further include, after the sealing of the connection wire, grinding the lower surface of the board to expose the connection wire to the outside.

The manufacturing method of an electronic device module may further include, after the sealing of the connection wire, electrically connecting the other end of the connection wire and an external connection terminal to each other.

The manufacturing method of an electronic device module may further include, after the sealing of the connection wire, forming a terminal groove in the sealed surface so that the other end of the connection wire is exposed; and electrically connecting an external connection terminal to the connection wire.

The manufacturing method of an electronic device module may further include, after the forming of the terminal groove, forming a metal layer on an internal surface of the terminal groove and a surface of the connection wire.

The manufacturing method of an electronic device module may further include, after the forming of the terminal groove, filling the terminal groove with a metal to form a bonding pad.

In the forming of the terminal groove, the terminal groove may be formed using laser drilling.

The bonding of the at least one connection wire may include: bonding one end of the connection wire to an external electrode pad of the board; lengthily extending the connection wire downwardly of the board; and bonding the connection wire to another external electrode pad of the board.

The bonding of the at least one connection wire may include: bonding one end of the connection wire to an external electrode pad of the board; lengthily extending the connection wire downwardly of the board; and cutting the connection wire.

BRIEF DESCRIPTION OF DRAWINGS

The above and other aspects, features and other advantages of the present disclosure will be more clearly understood from the following detailed description taken in conjunction with the accompanying drawings, in which.

DETAILED DESCRIPTION

Figure 1:
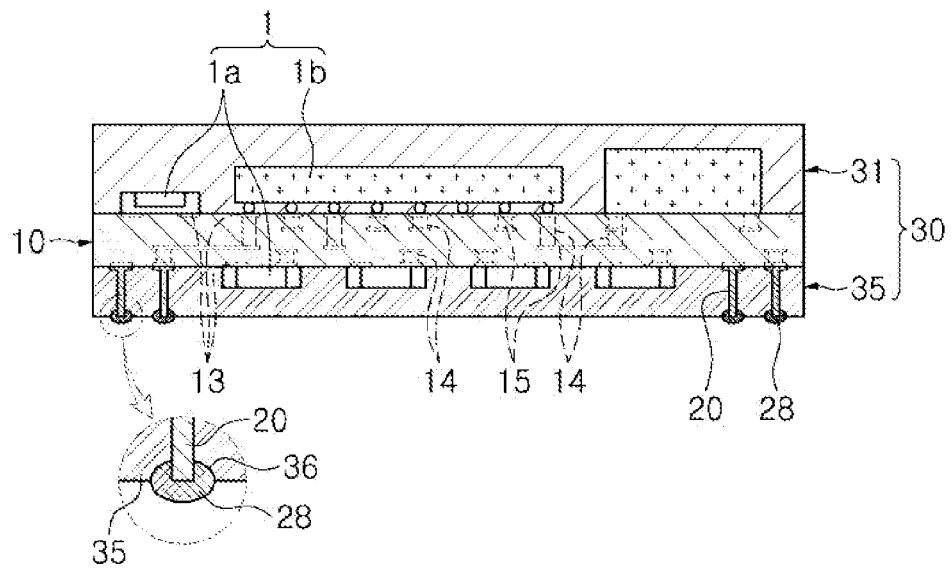
FIG. 1 is a cross-sectional view schematically showing an electronic device module according to an exemplary embodiment of the present disclosure.

Hereinafter, embodiments of the present disclosure will be described in detail with reference to the accompanying drawings. The disclosure may, however, be embodied in many different forms and should not be construed as being limited to the embodiments set forth herein. Rather, these embodiments are provided so that this disclosure will be thorough and complete, and will fully convey the scope of the disclosure to those skilled in the art. In the drawings, the shapes and dimensions of elements may be exaggerated for clarity, and the same reference numerals will be used throughout to designate the same or like elements.

Figure 2:
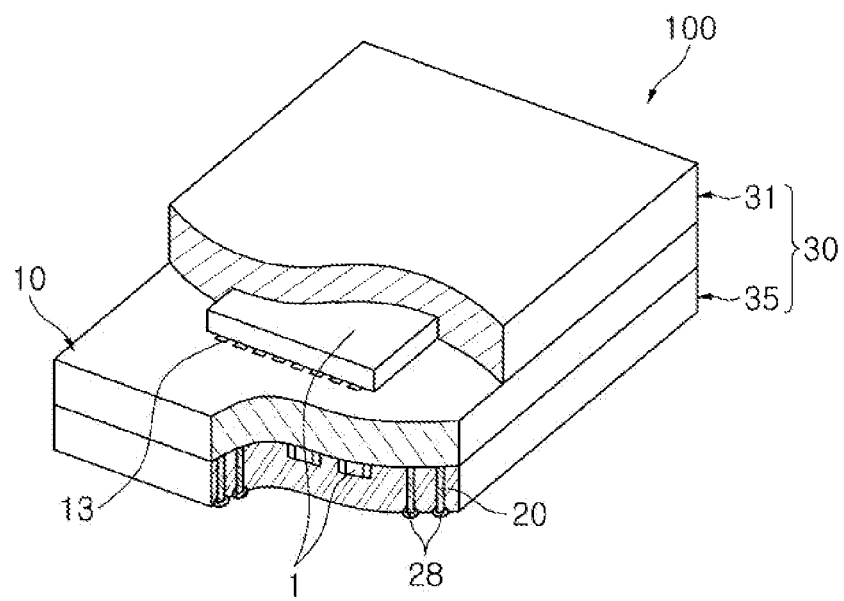
FIG. 2 is a partially cut-away perspective view showing an internal portion of the electronic device module shown in FIG. 1.
Figure 3:
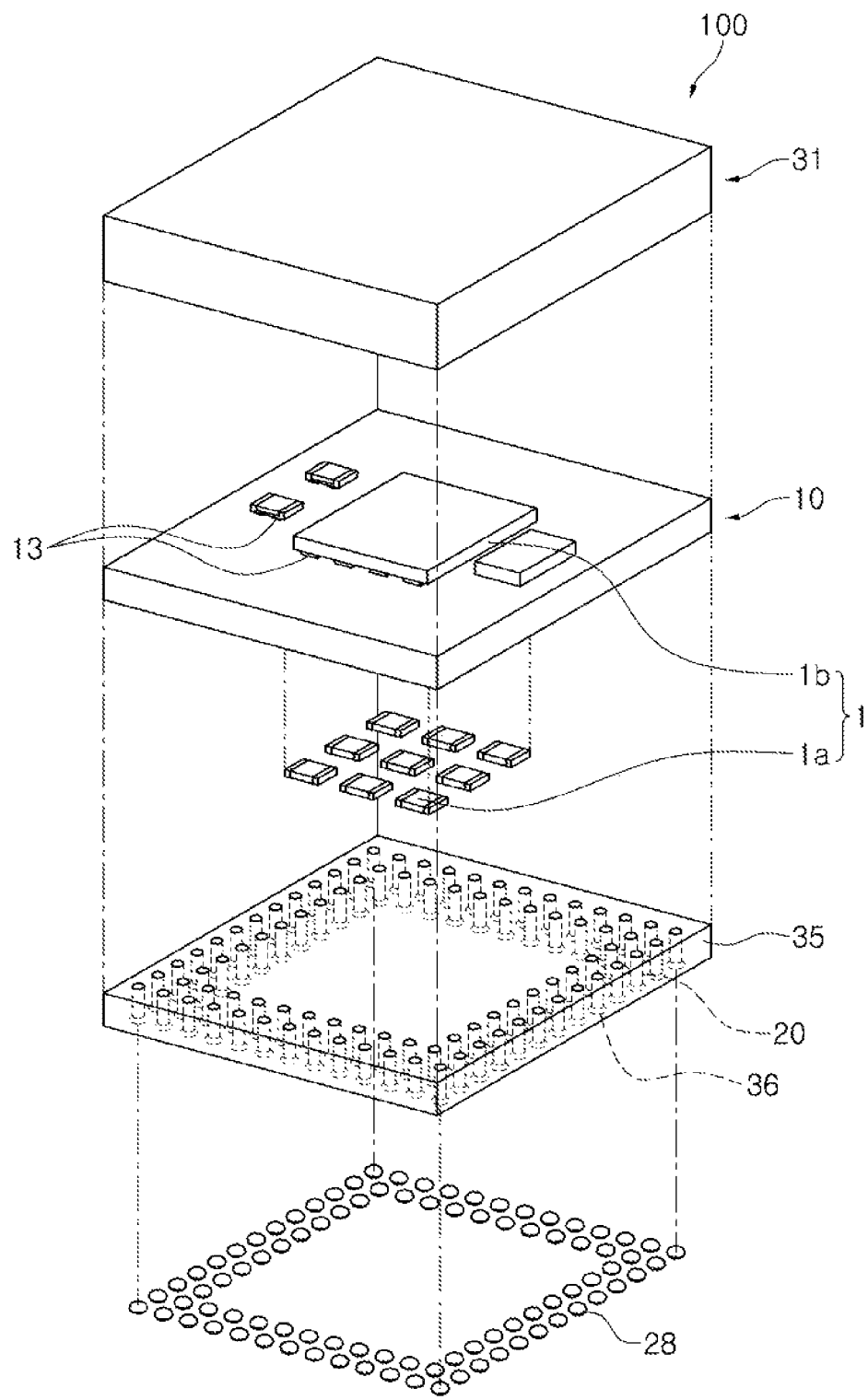
FIG. 3 is an exploded perspective view of the electronic device module shown in FIG. 1.
Figure 4:
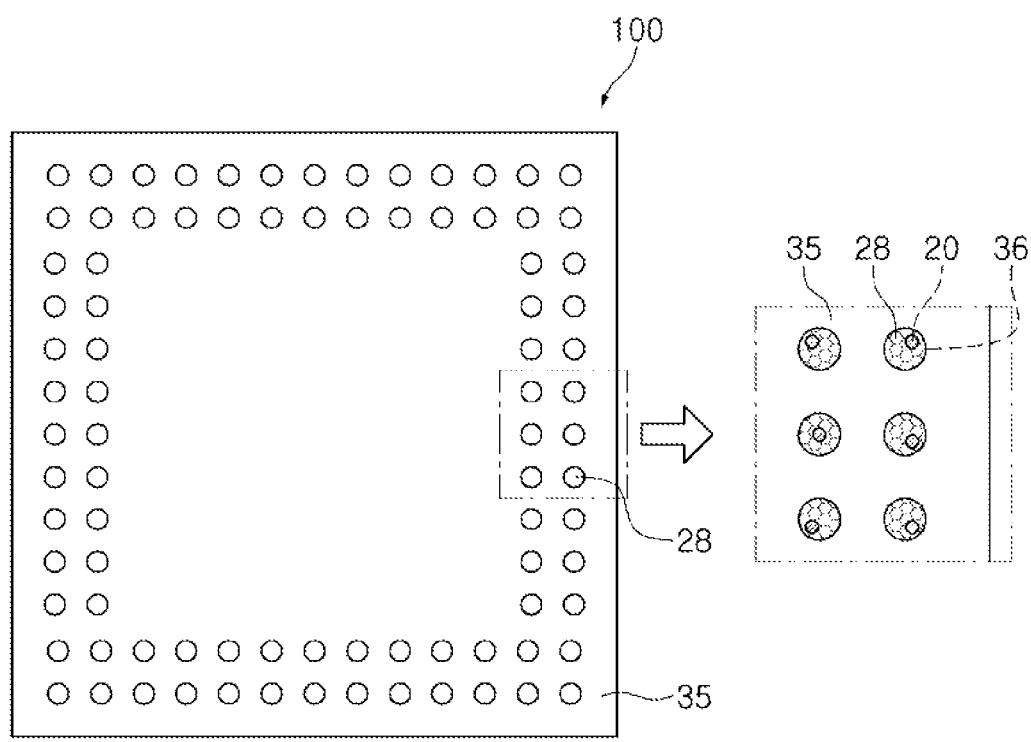
FIG. 4 is a bottom view of the electronic device module shown in FIG. 1.

FIG. 1 is a cross-sectional view schematically showing an electronic device module according to an exemplary embodiment of the present disclosure. In addition, FIG. 2 is a partially cut-away perspective view showing an internal portion of the electronic device module shown in FIG. 1; and FIG. 3 is an exploded perspective view of the electronic device module shown in FIG. 1. Further, FIG. 4 is a bottom view of the electronic device module shown in FIG. 1. Here, for convenience of explanation, an enlarged view of FIG. 4 shows a perspective view of external connection terminals so that positions of connection wires are represented.

Referring to FIGS. 1 through 4, an electronic device module 100 according to the present exemplary embodiment may include electronic devices 1, a board 10, connection wires 20, and a molded portion 30.

The electronic device 1 may include various devices such as a passive device 1a and an active device 1b and may be any electronic device 1 that may be mounted on the board.

The electronic devices 1 may be mounted on both of upper and lower surfaces of a board 10 to be described below. The case in which the active device 1b and the passive device 1a are mounted on the upper surface of the board 10 and only the passive device 1a is mounted on the lower surface of the board 10 has been shown by way of example in FIG. 1. However, the present disclosure is not limited thereto. That is, the electronic devices 1 may be disposed in various forms on both surfaces of the board 10 depending on sizes or shapes thereof and a design of the electronic device module 100.

The board 10 may have at least one electronic device 1 each mounted on both surfaces thereof. As the board 10, various kinds of boards (for example, a ceramic board, a printed circuit board (PCB), a flexible board, and the like) well known in the art may be used. The board 10 may include mounting electrodes 13 or wiring patterns (not shown) formed on both surfaces thereof, wherein the mounting electrodes 13 are formed for mounting the electronic devices 1 thereon and the wiring patterns electrically connect the mounting electrodes 13 to each other.

The board 10 according to the present exemplary embodiment described above may be a multilayer board including a plurality of layers, and circuit patterns 15 for forming electrical connection may be formed between each of the plurality of layers.

In addition, the board 10 according to the present exemplary embodiment may include conductive vias 14 electrically connecting the mounting electrodes 13 formed on both surfaces to each other and the circuit patterns 15 formed in the board 10 to each other.

Further, the board 10 according to the present exemplary embodiment may include cavities (not shown) formed therein so that the electronic devices 1 may be embedded therein.

Further, the board 10 according to the present exemplary embodiment may include external connecting pads 16 formed on the lower surface thereof. The external connecting pads 16 may be provided in order to be electrically connected to connection wires 20 to be described below and may be connected to external connection terminals 28 through the connection wires 20.

Meanwhile, the board 10 according to the present exemplary embodiment may be a board in which a plurality of same mounting regions are repeatedly disposed in order to simultaneously manufacture a plurality of individual modules. In detail, the board 10 according to the present exemplary embodiment may be a board having a long strip shape or a rectangular shape having a wide area. In this case, the electronic device module may be manufactured for each of a plurality of individual mounting regions.

The connection wire 20 may be disposed beneath the board 10 and be bonded to the board 10.

The connection wire 20 may be formed of gold, silver, aluminum, or copper, or an alloy thereof. A generally used bonding wire may be used as the connection wire 20.

The connection wire 20 may be bonded to the board 10 in a ball-bonding scheme. In detail, the connection wire 20 may have one end forming a wire ball, such that it may be bonded to the board 10 in the ball-bonding scheme and be then led lengthily in a straight line form downwardly of the board 10. Therefore, the connection wire 20 may be formed in a form in which it is led approximately vertically from the lower surface of the board 10 to the outside.

The connection wire 20 may have the external connection terminal 28 formed at the other end thereof. The external connection terminal 28 may electrically and physically connect the electronic device module 100 and a main board (not shown) on which the electronic device module 100 is mounted.

Therefore, the board 10 may be electrically connected to the external connection terminal 28 through the connection wire 20.

The external connection terminal 28 may be formed in a bump form, but is not limited thereto. That is, the external connection terminal 28 may be formed in various forms such as solder ball form, and the like.

The molded portion 30 may include a first molded portion 31 formed on the upper surface of the board 10 and a second molded portion 35 formed on the lower surface of the board 10.

The molded portion 30 may seal the electronic devices 1 mounted on both surfaces of the board 10. In addition, the molded portion 30 may be filled between the electronic devices 1 mounted on the board 10 to prevent an electrical short-circuit from being generated between the electronic devices 1, and may fix the electronic devices 1 onto the board while enclosing exterior portions of the electronic devices 1 to safely protect the electronic devices 1 from external impact.

The molded portion 30 may be formed of an insulating material containing a resin material such as epoxy, or the like. In addition, the molded portion 30 according to the present exemplary disclosure may be formed by disposing the board 10 on which the electronic devices 1 are mounted in a mold (not shown) and injecting a molding resin into the mold.

The first molded portion 31 according to the present disclosure may be formed in a form in which it entirely covers one surface of the board 10. In addition, the case in which all of the electronic devices 1 are buried in the first molded portion 31 has been described by way of example in the present exemplary embodiment. However, the present disclosure is not limited thereto, but may be variously applied. For example, at least one of the electronic devices 1 buried in the first molded portion 31 may be configured so as to be partially exposed to the outside of the first molded portion 31.

The second molded portion 35 may be formed on the lower surface of the board 10 in a form in which it buries the connection wires 20 therein.

The second molded portion 35 may be formed in a form in which it buries all of the electronic devices 1 therein, similar to the first molded portion 31. However, the second molded portion 35 may also be formed in a form in which the electronic devices 1 are partially exposed to the outside.

In addition, the second molded portion 35 may include terminal grooves 36 formed in portions at which the other ends of the connection wires 20 are disposed. Further, the external connection terminal 28 may be bonded to the other end of the connection wire 20 in a form in which it is at least partially accommodated in the terminal groove 36. Here, the other end of the connection wire 20, that is, a distal end of the connection wire 20 may protrude inwardly of the terminal groove 36 and may be coupled to the external connection terminal 28 in a form in which it is inserted into the external connection terminal 28, as shown in FIG. 1.

In the case in which the external connection terminal 28 is bonded to only a cross section of the distal end of the connection wire 20 without the terminal groove 36 according to the present exemplary embodiment, since a bonding area is limited to a cross-sectional area of the connection wire 20, the bonding area may be very narrow, such that it is likely that the external connection terminal 28 will be easily separated from the connection wire 20.

However, in the electronic device module 100 according to the present exemplary embodiment, a portion of an exterior peripheral surface of the distal end of the connection wire 20 as well as the distal end of the connection wire 20 may be bonded to the external connection terminal 28 in a form in which they are buried in the external connection terminal 28 by the terminal groove 36, as shown in FIG. 1.

Therefore, a bonding area between the external connection terminal 28 and the connection wire 20 may be maximally secured, such that reliability in bonding between the external connection terminal 28 and the connection wire 20 may be secured.

In addition, in the case in which the terminal groove 36 are formed as in the present exemplary embodiment, the external connection terminal 28 and the connection wire 20 may be more easily connected to each other. Since the connection wire 20 is bonded to the board 10 in the wire bonding scheme, it may be difficult to precisely control a position of the distal end of the connection wire 20. Therefore, as shown in FIG. 4, the distal end of the connection wire 20 is not disposed at an accurate position (for example, the center of the terminal groove), but is biased toward one side, such that an error may occur.

Therefore, in the case in which the external connection terminals 28 are directly coupled to the distal ends of the connection wires 20 without the terminal grooves 36, the external connection terminals 28 may be disposed as they are without correcting error distances of the distal ends of the connection wires 20. Therefore, an error may occur in disposition of the external connection terminals 28.

However, in an exemplary embodiment of the present disclosure, the terminal grooves 36 may be formed at accurate positions, and the distal ends of the connection wires 20 may be formed in a form in which they partially protrude within the terminal grooves 36. Here, since an error distance of the distal end of the connection wire 20 is smaller than a size (for example, diameter) of the terminal groove 36, even though an error occurs, the distal end of the connection wire 20 may be disposed in a range of the terminal groove 36.

Therefore, when the external connection terminal 28 are formed in the terminal grooves 36, the external connection terminals 28 may not be only easily electrically connected to the connection wires 20 protruding within the terminal grooves 36, but also be disposed in the terminal grooves 36 formed at accurate positions, such that the external connection terminals 28 may be formed at accurate positions.

In the electronic device module 100 according to the present exemplary embodiment configured as described above, the electronic devices 1 may be mounted on both surfaces of the board 10. In addition, the board 10 and the external connection terminals 28 may be electrically connected to each other by the connection wires 20 disposed on the lower surface of the board 10.

Therefore, a plurality of electronic devices 1 may be mounted on one board (that is, board), such that a degree of integration of the devices may be increased.

In addition, since the board 10 and the external connection terminals 28 are electrically connected to each other using the connection wires 20, the external connection terminals 28 may be easily formed in a double-sided molding structure.

Further, in the electronic device module 100 according to the present exemplary embodiment, the terminal grooves 36 may be formed in portions at which the distal ends of the connection wires 20 are disposed on a surface of the molded portion 30, and the external connection terminals 28 may be bonded to the connection wires 20 while being accommodated in the terminal grooves 36.

Therefore, since the connection wires 20 are bonded to the external connection terminals 28 in a form in which they are partially buried in the external connection terminals 28, even though the connection wires 20 are used, reliability in bonding between the connection wires 20 and the external connection terminals 28 may be secured.

Next, a manufacturing method of an electronic device module according to the present exemplary embodiment will be described.

FIGS. 5A through 5K are cross-sectional views for describing a manufacturing method of an electronic device module according to an exemplary embodiment of the present disclosure.

Figure 5A:
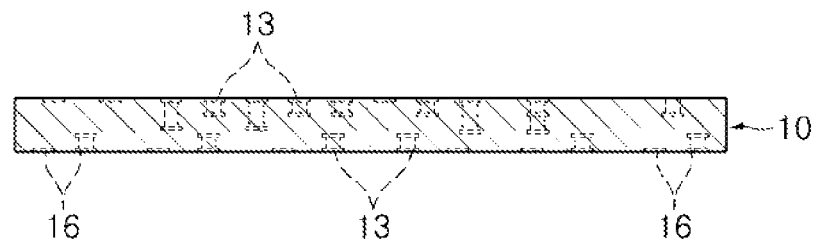
FIGS. 5A through 5K are cross-sectional views for describing a manufacturing method of an electronic device module according to an exemplary embodiment of the present disclosure.

First, as shown in FIG. 5A, an operation of preparing the board 10 may be performed. As described above, the board 10 may be a multilayer board, and may have the mounting electrodes 13 formed on both surfaces thereof. In addition, the board 10 may have the external connecting pads 16 formed on the lower surface thereof.

Figure 5B:
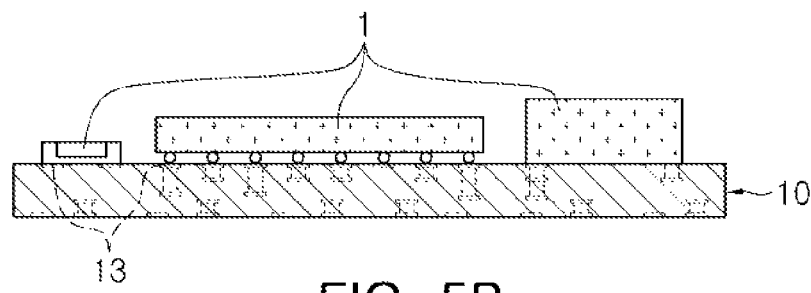

Then, as shown in FIG. 5B, an operation of mounting the electronic devices 1 on one surface, that is, the upper surface, of the board 10 may be performed. The present operation may be performed by printing solder pastes on the mounting electrodes 13 formed on one surface of the board 10 in a screen printing scheme, or the like, seating the electronic devices 1 on the solder pastes, and applying heat to harden the solder pastes.

Figure 5C:
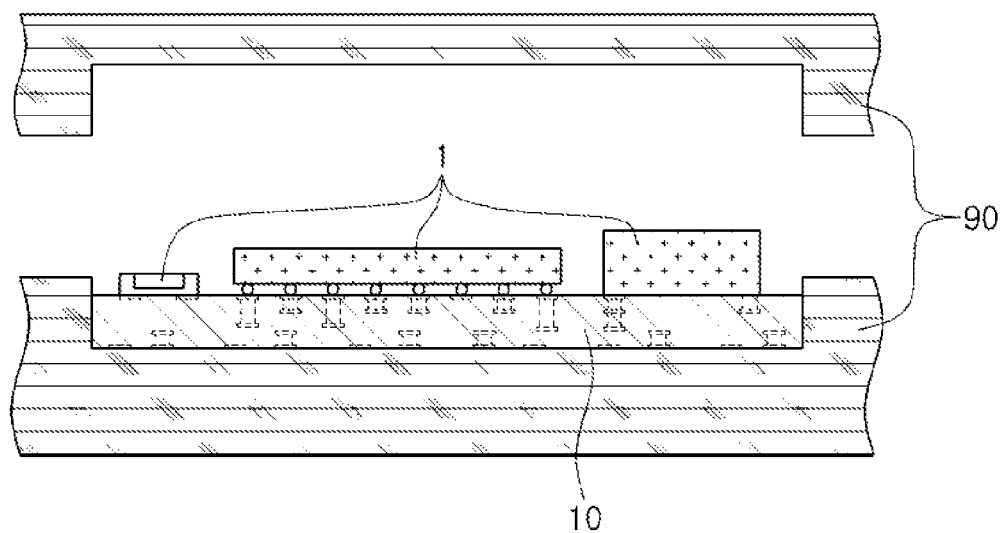

Then, an operation of forming the first molded portion on one surface of the board 10 may be performed. In the present operation, as shown in FIG. 5C, the board 10 on which the electronic devices 1 are mounted may be first disposed in a mold 90.

Figure 5D:
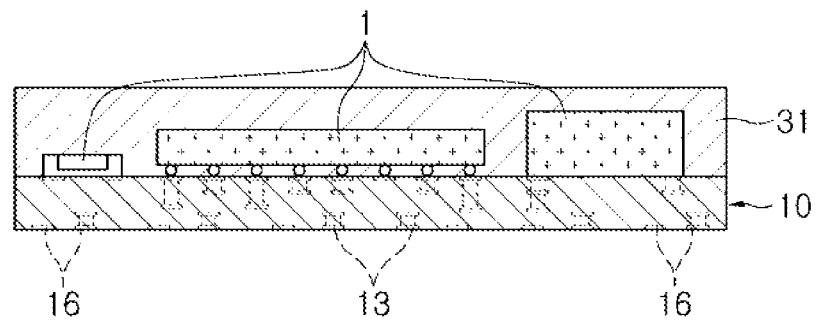

Then, a molding resin may be injected into the mold 90 to form the first molded portion. Therefore, as shown in FIG. 5D, the electronic devices 1 mounted on one surface, that is, the upper surface, of the board 10 may be protected from the outside by the first molded portion 31.

Figure 5E:
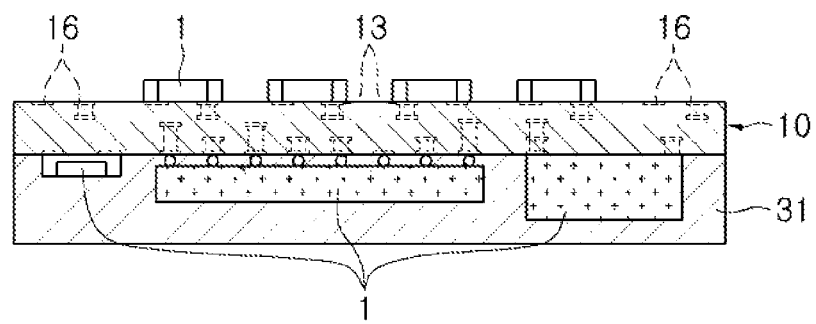

Then, as shown in FIG. 5E, an operation of mounting the electronic devices 1 on the lower surface of the board 10 may be performed. The present operation may be performed by printing solder pastes on the mounting electrodes 13 in a screen printing scheme, or the like, seating the electronic devices 1 on the solder pastes, and applying heat to harden the solder pastes.

Figure 5F:
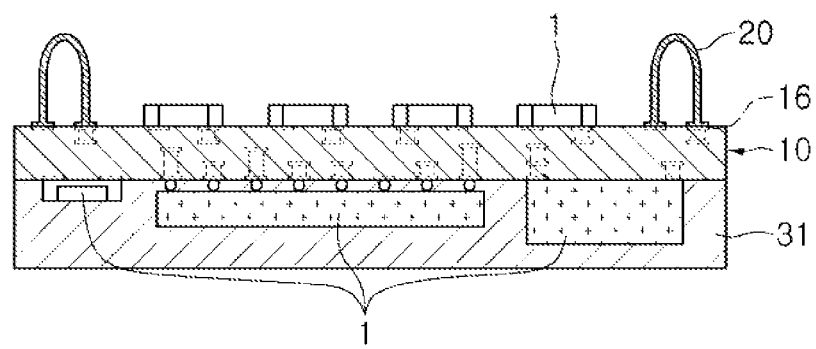

Next, an operation of forming the connection wires 20 on the lower surface of the board 10 may be performed. The present operation may be performed in a scheme of lengthily leading the connection wire 20 in a state in which one end of the connection wire 20 is bonded to one external connecting pad 16 of the board 10 and then bonding the other end of the connection wire 20 to another external connecting pad 16, as shown in FIG. 5F.

Therefore, in the present operation, the connection wire 20 may be formed in a wire loop form in which two external connecting pads 16 are connected to each other.

Here, the connection wire 20 may be bonded to the board 10 in the ball-bonding scheme. However, the present disclosure is not limited thereto, but may be variously modified. For example, the connection wire 20 may be bonded to the board 10 in a wedge-bonding scheme.

Figure 5G:
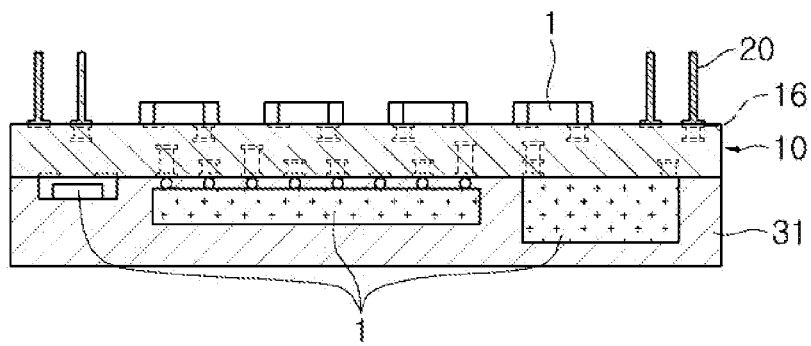

Meanwhile, in the present operation, the connection wires 20 may be bonded to the board 10 in various forms. For example, the connection wires 20 are not formed in the wire loop form, but may also be formed in a straight line form on the external connection pads 16, respectively, as shown in FIG. 5G.

In the present exemplary embodiment, the connection wire 20 may be formed by bonding one end thereof to an external connecting pad 16, being lengthily extended to the outside, and cutting the other end thereof.

Meanwhile, although the case in which the connection wires 20 are formed after the electronic devices 1 are mounted on the lower surface of the board 10 has been described by way of example in the present exemplary embodiment, the present disclosure is not limited thereto. That is, the electronic devices 1 may be mounted after the connection wires 20 are formed on the board 10.

Figure 5H:
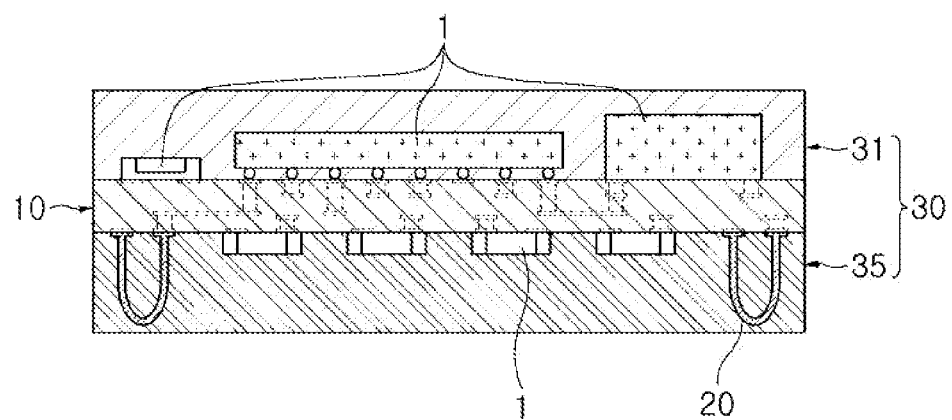

Next, an operation of forming the second molded portion 35 beneath the board 10 may be performed. The present operation may be performed by disposing the board 10 in the mold 90 and then injecting a molding resin into the mold 90, similar to the case shown in FIG. 5C. Meanwhile, in the present exemplary embodiment, the second molded portion 35 may be formed so that the connection wires 20 are completely buried therein, as shown in FIG. 5H. However, a configuration of the present disclosure is not limited thereto.

For example, the molding resin is injected in a state in which a distal end of the connection wire 20 contacts an internal surface of the mold 90, such that a portion (that is, a distal end) of the connection wire 20 may be exposed to the outside of the second molded portion 35. In this case, since positions of the distal ends of the connection wires 20 may be identified with the naked eyes, positions of the connection wires 20 may be more easily recognized.

Figure 5I:
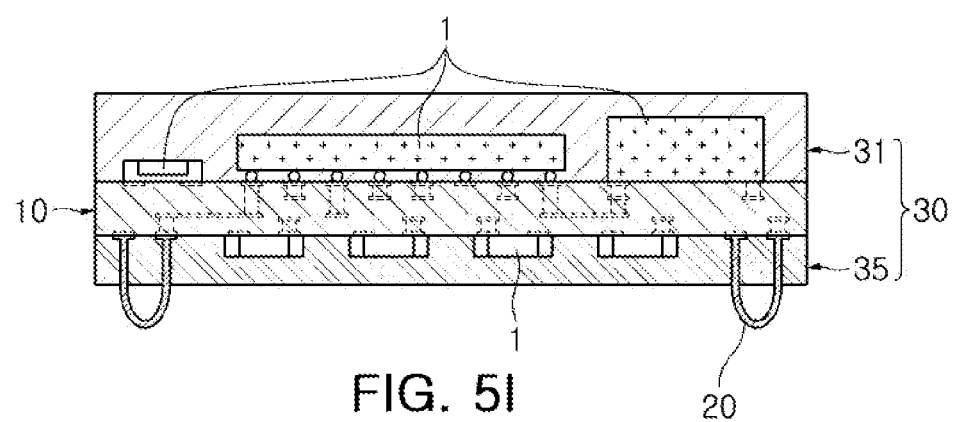

In addition, various applications may be possible. For example, the second molded portion 35 may be formed so that portions of the distal ends of the connection wires 20 protrude to the outside thereof, as shown in FIG. 5I.

Figure 5J:
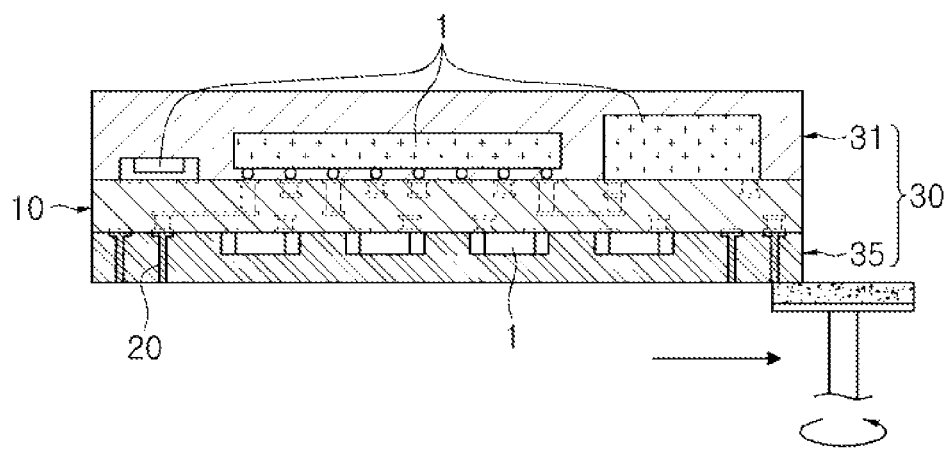

Then, as shown in FIG. 5J, a lower surface of the second molded portion 35 may be grinded to remove an unnecessary portion and expose the distal ends of the connection wires 20 to which the external connection terminals 28 are to be attached to the outside. Here, the second molded portion 35 may be grinded by a grinder, or the like.

Figure 5K:
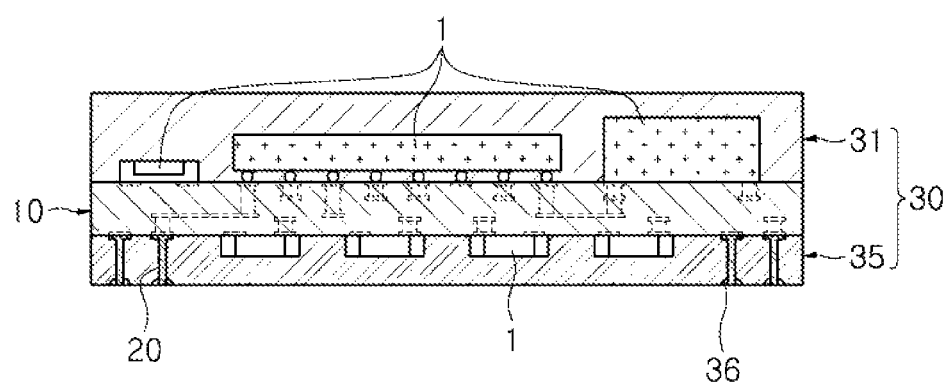

Then, as shown in FIG. 5K, the terminal grooves 36 may be formed at portions at which the distal ends of the connection wires 20 are disposed. The terminal groove 36 may be formed at a size corresponding to that of the external connection terminal 28 attached to the connection wire 20.

The terminal groove 36 according to the present exemplary embodiment may be formed by laser drilling. However, the present disclosure is not limited thereto.

Then, the external connection terminals 28 are formed in the terminal grooves 36 and are coupled to the connection wires 20, such that the electronic device module 100 according to the present exemplary embodiment shown in FIG. 1 may be completed.

Here, the external connection terminals 28 may be formed in various forms such as a bump form, a solder ball form, or the like.

In the electronic device module 100 according to the present exemplary embodiment manufactured through the above-mentioned operations, the electronic devices 1 may be mounted on both surfaces of the board 10 and be sealed by the molded portion 30. Therefore, many devices may be mounted in one electronic device module 100 and be easily protected from the outside.

In addition, in the electronic device module 100 according to the present exemplary embodiment, the board 10 may be electrically connected to the outside through the connection wires 20. Therefore, even though the molded portions 30 are formed on both surfaces of the board 10, the external connection terminals 28 may be easily disposed.

Meanwhile, the case in which the terminal grooves are formed and the external connection terminals are disposed in the terminal grooves has been described by way of example in the above-mentioned exemplary embodiment. However, in the case in which wires having a sufficiently large diameter (for example, a diameter of 150 μm or more) are used as the connection wires, the external connection terminals may be bonded to only the distal ends of the connection wires, and the terminal grooves may be omitted.

In addition, the case in which the external connection terminals are directly coupled to the connection wires has been described by way of example in the above-mentioned exemplary embodiment. However, metal layers may be formed between the connection wires and the external connection terminals in order to increase coupling force between the connection wires and the external connection terminals.

Figure 6:
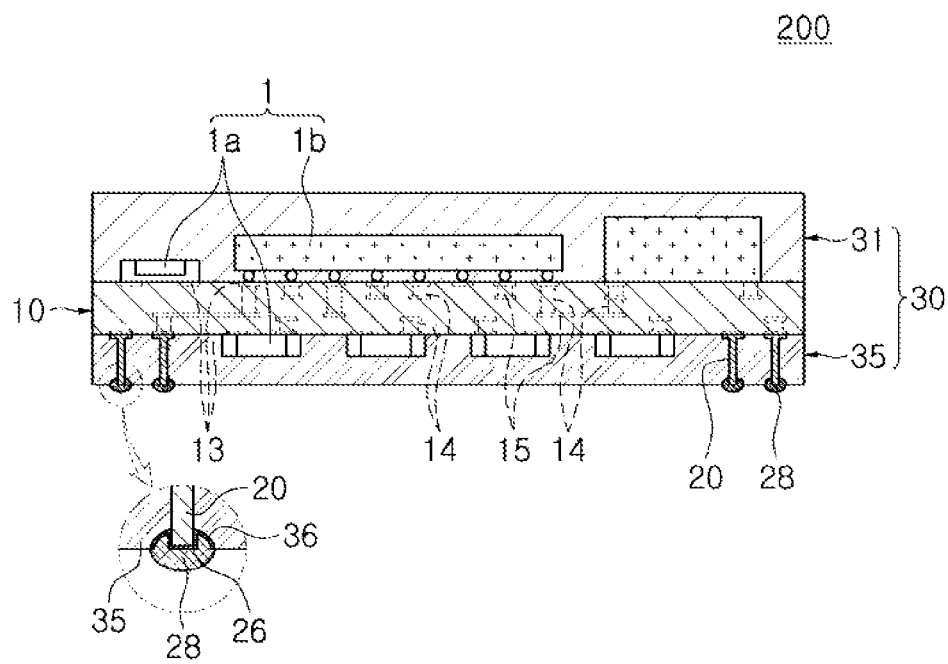
FIG. 6 is a cross-sectional view schematically showing an electronic device module according to another exemplary embodiment of the present disclosure.

FIG. 6 is a cross-sectional view schematically showing an electronic device module according to another exemplary embodiment of the present disclosure.

Referring to FIG. 6, in an electronic device module 200 according to the present exemplary embodiment, metal layers 26 may be interposed between the connection wires 20 and the external connection terminals 28.

The metal layer 26 according to the present exemplary embodiment may be a plating layer formed along a surface of the connection wire 20 or an internal wall of the terminal groove 36.

To this end, a manufacturing method of an electronic device module 200 according to the present exemplary embodiment may further include, after the operation of FIG. 5K described above, forming a plating layer on the internal wall of the terminal groove 36 and a surface of the connection wire 20 protruding in the terminal groove 36.

Here, the plating layer may be formed through electroplating or electroless plating, and may be formed by a method such as a sputtering method, a thin film depositing method, or the like.

Figure 7:
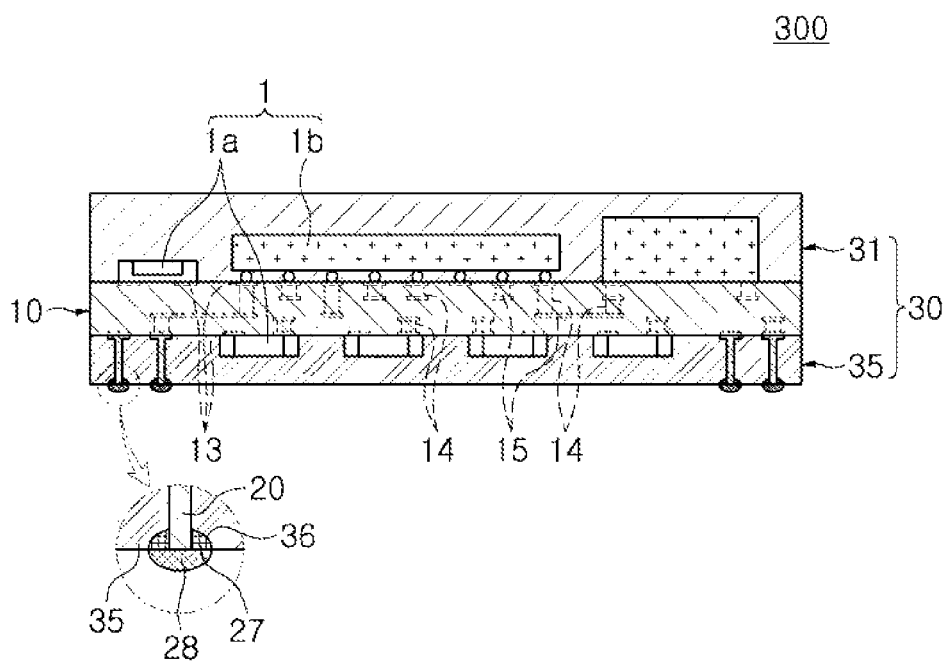
FIG. 7 is a cross-sectional view schematically showing an electronic device module according to another exemplary embodiment of the present disclosure.

FIG. 7 is a cross-sectional view schematically showing an electronic device module according to another exemplary embodiment of the present disclosure.

Referring to FIG. 7, in an electronic device module 300 according to the present exemplary embodiment, metal layers interposed between the connection wires 20 and the external connection terminals 28 may become the electrode pads 27.

The electrode pad 27 may be formed by filling a conductive material such as solder pastes in the terminal groove 36 and hardening the conductive material, after the operation of FIG. 5K described above. In addition, the plating may be used, similar to the above-mentioned exemplary embodiment.

In exemplary embodiments shown in FIGS. 6 and 7, since the external connection terminals 28 are surface-bonded to the metal layers 26 or the electrode pads 27, a wider bonding area may be secured, such that reliability in bonding may be increased.

Hereinabove, although exemplary embodiments of the present disclosure have been described in detail, it will be apparent to those skilled in the art that the scope of the present disclosure is not limited thereto, but may be variously modified and altered without departing from the spirit and scope of the present disclosure as defined by the claims.

For example, although the case in which the connection wires are disposed only beneath the board has been described by way of example in the above-mentioned exemplary embodiments, the present disclosure is not limited thereto, but may be variously applied. That is, the connection wires and the external connection terminals may be disposed on the board.

In addition, although the case in which the connection wires are straightly disposed in a vertical direction has been described by way of example in the above-mentioned exemplary embodiments, the connection wires may also be obliquely disposed, if necessary.

As set forth above, in the electronic device module according to an exemplary embodiment of the present disclosure, the electronic devices may be mounted on both surfaces of the board. In addition, the external connection terminal may be formed by the connection wire disposed on the lower surface of the board. Therefore, a plurality of electronic devices may be mounted on one board (that is, board), such that a degree of integration of the devices may be increased.

In addition, since the external connection terminal of the board on which the electronic devices are mounted is formed using the connection wire provided on a separate board, the external connection terminal of a double-sided mounting type electronic device module may be easily formed.

Further, in the electronic device module according to an exemplary embodiment of the present disclosure, the first and second molded portions may be formed at a thickness corresponding to a maximum mounting height of the electronic device embedded in the electronic device module. Therefore, since an entire thickness of the electronic device module may be significantly decreased, the electronic device module according to an exemplary embodiment of the present disclosure may be easily used in a thin electronic apparatus. Furthermore, since a portion of the electronic device is exposed to the outside, a heat radiation effect may be improved.

In addition, in the electronic device module according to an exemplary embodiment of the present disclosure, the second molded portion may be formed in a state in which the lower surface of the connection wire and one surface of the electronic device contact the internal surface of the mold. Therefore, the second molded portion, a configuration in which one surface of the electronic device mounted in a penetration part of the connection wire is exposed to the outside of the second molded portion, and a configuration in which the lower surface of the connection wire and the lower surface of the second molded portion are disposed on the same plane may be implemented at a time. Therefore, even though the electronic device module includes various configurations, it may be vary easily manufactured.

While exemplary embodiments have been shown and described above, it will be apparent to those skilled in the art that modifications and variations could be made without departing from the spirit and scope of the present disclosure as defined by the appended claims.

What is claimed is:

1. An electronic device module comprising:
   a board having mounting electrodes formed on opposite surfaces of the board;
   electronic devices respectively mounted on the mounting electrodes;
   a molded portion sealing the electronic devices;
   a connection wire comprising a bonding wire, the connection wire having an end bonded to a surface of the board, and another end exposed to the outside of the molded portion; and
   an external connection terminal coupled to the another end of the connection wire.

2. The electronic device module of claim 1, wherein the molded portion has a terminal groove formed in a surface of the molded portion, and wherein the another end of the connection wire is exposed into the terminal groove.

3. The electronic device module of claim 2, wherein the external connection terminal is coupled to the connection wire protruding into the terminal groove.

4. The electronic device module of claim 2, wherein at least a portion of the external connection terminal is accommodated in the terminal groove.

5. The electronic device module of claim 2, further comprising a metal layer formed on an internal surface of the terminal groove and a surface of the connection wire.

6. The electronic device module of claim 2, further comprising a metal layer filled in the terminal groove to form an electrode pad.

7. The electronic device module of claim 2, wherein the external connection terminal is bonded to the electrode pad.

8. The electronic device module of claim 1,
wherein the external connection terminal is directly coupled to the another end of the connection wire.

* * * * *